United States Patent [19]
Jones

[11] Patent Number: 5,455,522
[45] Date of Patent: Oct. 3, 1995

[54] PROGRAMMABLE LOGIC OUTPUT DRIVER

[75] Inventor: Anthony M. Jones, Bristol, Great Britain

[73] Assignee: Discovision Associates, Irvine, Calif.

[21] Appl. No.: 82,264

[22] Filed: Jun. 24, 1993

[30] Foreign Application Priority Data

Jun. 26, 1992 [EP] European Pat. Off. ............. 92305930

[51] Int. Cl.$^6$ ................................................. H03K 17/16
[52] U.S. Cl. ................................ 326/27; 326/50; 326/83
[58] Field of Search ........................... 307/296.8, 296.5, 307/443, 451; 323/315; 326/27, 121, 50, 83

[56] References Cited

U.S. PATENT DOCUMENTS

| | | | |
|---|---|---|---|
| 3,980,898 | 9/1976 | Priel | 307/209 |
| 4,584,492 | 4/1986 | Sharp | 307/443 |
| 4,608,530 | 8/1986 | Bacrania | 307/296.8 |
| 4,623,799 | 11/1986 | Nyman, Jr. | 307/260 |
| 4,894,561 | 1/1990 | Nogami | 307/443 |
| 5,111,081 | 5/1992 | Atallah | 307/443 |
| 5,124,632 | 6/1992 | Greaves | 307/296.8 |
| 5,157,285 | 10/1992 | Allen | 307/296.8 |
| 5,235,222 | 8/1993 | Kondoh et al. | 307/443 |

FOREIGN PATENT DOCUMENTS 451365  10/1991  European Pat. Off. .

OTHER PUBLICATIONS

"Soft Turn-on OCD Circuit," IBM Tech. Disclosure Bulletin, vol. 30, No. 8, Jan. 1988, pp. 455–456.

*Primary Examiner*—Edward P. Westin
*Assistant Examiner*—Andrew Sanders
*Attorney, Agent, or Firm*—Ronald J. Clark; Robert T. Braun

[57] ABSTRACT

A programmable logic output driver includes a bias generator (100), a current mirror (200) and an output stage (300), there being a digital programming feature to maintain the output voltage slew rate at an acceptable value for either high or low values of load capacitances. The driver is programmable and can maintain a constant value of driver output resistance in the circumstances where the load voltage approaches the full swing logic voltage. In the preferred embodiment, the programmed output resistance is independent of variations in process, temperature and VDD supply voltage. TTL loads are driven with the minimum amount of required output current. Because of the constant resistance, the driver supplies a specified amount of current to the load even when the load is pulled down to a specified voltage. The resistance value is substantially the highest value possible consistent with providing a required minimum load drive current and the resistive damping of the output RLC circuit is maximized so that voltage "kick" or "undershoot" is held to a minimum.

23 Claims, 6 Drawing Sheets

PROGRAMMABLE BIAS GENERATOR

SWITCH MIRROR INPUT

PROGRAMMABLE LOGIC OUTPUT DRIVER

This invention relates to CMOS logic output drive circuitry, particularly circuitry which is used to drive logic signals off chip into TTL (transistor-transistor logic) loads.

Typical prior art output circuits used to drive TTL loads employ high current CMOS output drivers. These drivers suffer from several limitations. One limitation is that the output current provided by a simple CMOS output driver depends on several process-dependent parameters such as device mobility and gate oxide thickness. Some process-dependent parameters such as mobility in turn depend highly on operating temperature.

Another weakness of simple CMOS drivers is that the output current provided depends on the input voltage, which is usually equal to the VDD power supply voltage. This VDD voltage may, however, vary by as much as ±10 percent. To account for all process, temperature and voltage effects, output drivers may be designed to nominally provide more output current than the minimum required to drive the load. This "safety margin" ensures that there will be enough current to drive the output load, but for a fast process, with high mobility and high drive currents, the output current provided may be several times the minimum required.

Drive currents provided by CMOS chips may even have to be increased beyond the minimum DC requirements in cases where high-capacitance loads are encountered. In the case where such a semiconductor chip drives low-capacitance loads, severe problems may then result from a high current driving a low capacitance. This causes a high voltage slew rate (rate of change of voltage per unit of time). A high voltage slew rate such as 2 volts per nanosecond may inject noise into the driver circuitry, and this may upset the data stored in some sensitive circuits such as CMOS dynamic memories.

As is well known in the art of digital design, TTL logic devices have two principle voltage states: a HIGH state, with a voltage above a given upper threshold (the output becomes a digital "1") and a LOW state, in which a voltage is below a given lower threshold (the output becomes a digital "0"). The TTL device may typically assume either state at its input and output.

It is usually preferred that the TTL device be able to switch quickly from one state to another and an output driver must therefore be able to source or sink output current quickly. An additional problem is thereby encountered in high-speed output drivers when the load voltage drive rapidly nears the full swing logic 0 voltage. As the output nears 0, the output current drive changes rapidly and a high transient voltage may be produced across the lead and track inductance in series with the load. It is well known that the voltage across an inductance increases in direct proportion to the size of the inductance and the time rate of change of current. The voltage "kick" or "undershoot" across the inductance may thus be large enough to turn on parasitic diodes in the loads and generate noise currents that upset the logic state of the load (the state of the attached load may switch inadvertently from a "1" to a "0" or vice versa) or even cause the device to fail in a mode known as "latch up."

According to one aspect, the invention provides a programmable logic output driver including a digital programming feature to maintain the output voltage slew rate at an acceptable value for either high or low values of load capacitances, the driver being operable so that it can maintain a constant value of the driver output resistance in the circumstances where the load voltage approaches the full swing logic voltage. Other aspects of the invention are exemplified by the attached claims.

In a preferred embodiment, the driver has programmed output resistance that is independent of variations in process, temperature and VDD supply voltage. Such a driver can thus drive TTL loads with the minimum amount of required output current. Because of the constant resistance, the driver can be designed to supply a specified amount of current to a load even when the load is pulled down to a specified voltage. The resistance value is substantially the highest value possible consistent with providing a required minimum load drive current and the resistive damping of the output RLC circuit is maximized so that, voltage "kicks" or "undershoot" is held to a minimum. According to this preferred embodiment, the output of a programmable bias generator is used to control the input gate of a switched current mirror, which provides a predetermined current gain. The output from the current mirror in turn controls the gate of an output drive device, but this gate can also be shunted to ground by a controllable switching device.

According to another aspect of the invention, a MOS device is included in one path to ground of the current mirror in order to compensate for the added resistance of a programmable switch included in the bias generator.

According to yet another aspect of the invention, a current generator that generates a small holding current which, under the control of a separate control signal, provides a holding current to the output drive device.

In yet another embodiment of the invention, multiple, controllable, switch mirrors and a mirror selection circuit are provided so that additional ranges for changing the conductance of the output stage are incorporated.

It will thus be apparent that aspects of this invention can be implemented to provide an output driver that is programmable in order to maintain output voltage slew rates at an acceptable value for either high or low values of load capacitances. Moreover it is possible to provide an output driver which can be set so that the driver output resistance is substantially constant in the regime where the load voltage approaches the full swing logic voltage, whilst the programmed output resistance is independent of variations in process, temperature and VDD supply voltage.

Two significant benefits are derived from achieving constant output resistance, independent of process and supply voltage. The first is that in order to drive TTL (transistor-transistor-logic) loads properly, a specified amount of current must be supplied to the load when it is pulled down to a specified voltage. By considering the well known Ohms Law ("current equals voltage divided by resistance"), it is apparent that an output with constant resistance characteristics can always provide the specified minimum current at the specified minimum voltage because the ratio of a constant voltage to a constant current is a constant resistance. The second benefit is that by providing a constant driver output resistance, the resistor-inductor-capacitor (RLC) characteristics of the load are constant in the region where the output voltage nears the full swing logic voltage, especially logic 0. Because the resistance value is substantially constant and at the highest value possible consistent with providing a required minimum load drive current, the resistive damping of the output LC circuit is maximized and voltage "undershoot" or "kicks" are held to a minimum.

For a better understanding of the invention and to show how the same may be carried into effect, reference will now be made, by way of example, to the accompanying drawings, in which.

Figure 1:
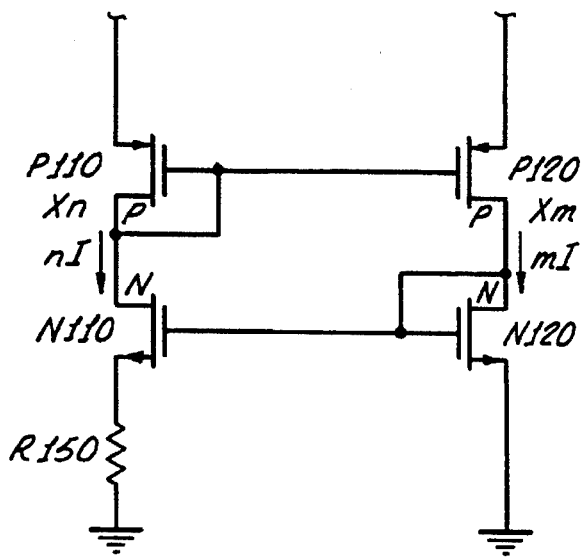
FIG. 1 is a schematic diagram illustrating a prior art bias generator.

A bias current generator according to the prior art is shown in FIG. 1. The gates of two P-channel devices P110, P120 are connected, as are the gates of two N-channel devices N110, N120. The sources of P110 and P120 are connected to a source of supply voltage and their drains are connected to the drains of the corresponding N-channel devices N110 and N120, respectively. The drains and gates of both P110 and N120 are connected. The source of N120 is connected to ground as is the source of N110, albeit over a resistor R150.

Assume that the N-channel devices N110 and N120 have the same effective width-to-length ratios $W_e/L_e$. Assume also that the P-channel devices P110 and P120 are constructed using m and n multiples of unit devices with the same W/L ratio. In such case, the total current through device P120 will be mI, the total current through device P110 will be nI and the ratio of current in P120 to P110 will therefore be m/n. With these conditions it can be shown using well known formulae that the operating conditions for the N-channel devices are given by:

$$\text{Beta} \cdot W_e/L_e \cdot (V_o - V_t) = (2/R_{150}) \cdot (\text{sqrt } m/n) \cdot (\text{sqrt } m/n - 1) \quad \text{E1}$$

where Beta is the product of mobility and oxide capacitance, $V_o$ is the NMOS gate voltage, $V_t$ is the NMOS threshold, "sqrt" indicates the square root operator, and $R_{150}$ is the value of the resistance of the resistor so labelled. Sometimes, the quantity $(V_o - V_t)$ is expressed as the effective gate drive, that is, $V_o - V_t = V_e$. Making this substitution, the expression above becomes:

$$\text{Beta } W_e/L_e (V_e) = (2/R_{150}) \text{ (sqrt } m/n\text{) (sqrt } m/n - 1) \quad \text{E2}$$

This kind of bias circuit is commonly used in the prior art to establish a bias reference voltage for a constant current generator. The bias voltage $V_e$ can then be found simply by re-arranging the terms in the last equation to yield:

$$V_e = [(2/R) \cdot (\text{sqrt } m/n) \cdot (\text{sqrt } m/n - 1)][\text{Beta} \cdot W_e/L_e] \quad \text{E3}$$

Unfortunately, the effective gate drive $V_e$ is not constant over process or temperature in the bias generators of the prior art. Neither is the drain current constant, because the drain current Id for a MOS device in saturation is given by the known formula:

$$Id = \text{Beta } (W_e/L_e) (V_e)^2 \quad \text{E4}$$

Figure 2:
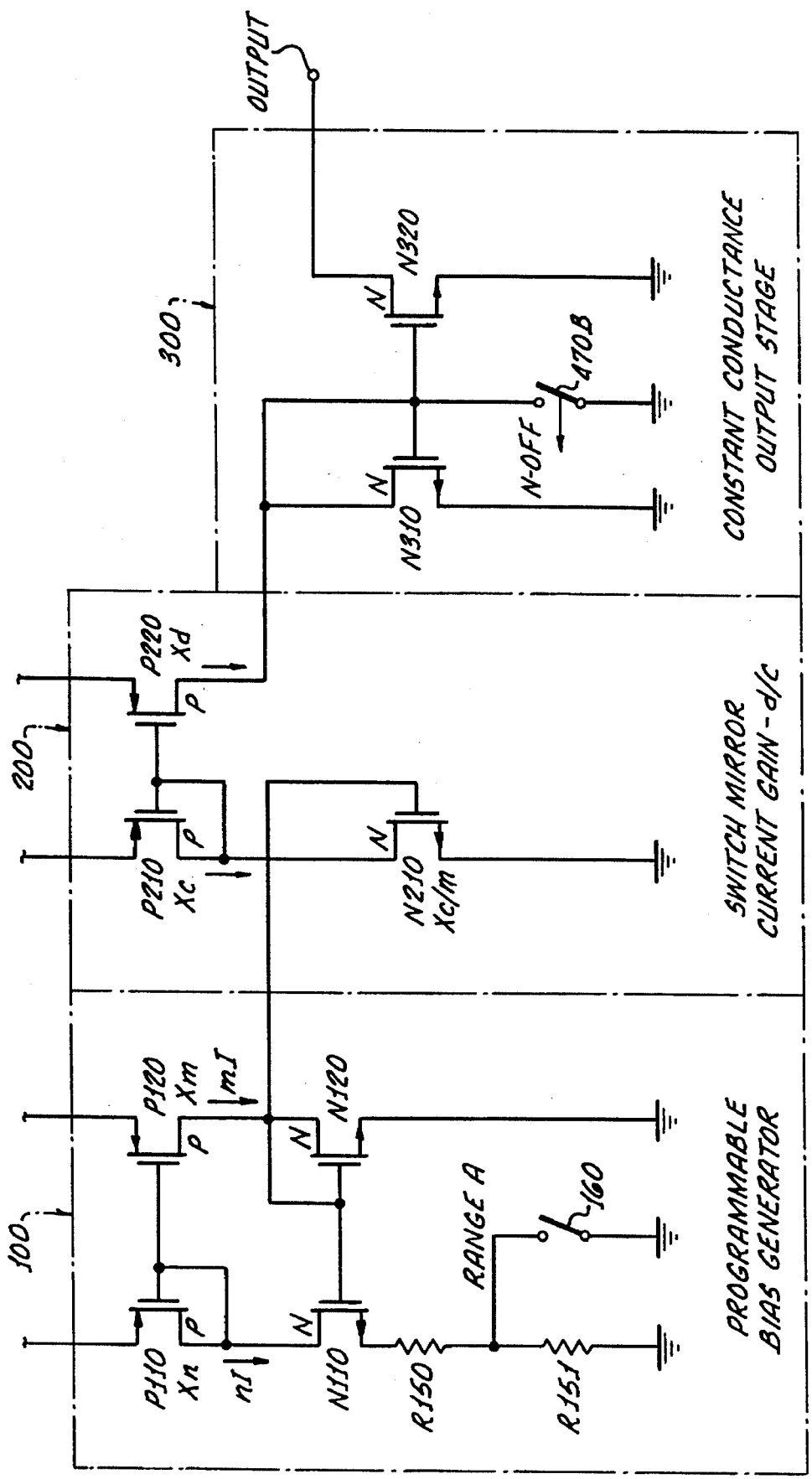
FIG. 2 is a schematic diagram that shows generally certain principle features of one embodiment of the invention.

The embodiment of FIG. 2 improves upon the prior art generator shown in FIG. 1 by providing a programmable output conductance for a switchable output driver N320. As FIG. 2 shows, a modified bias generator is connected to a switched current mirror, which in turn is connected to a constant conductance output stage.

As FIG. 2 shows, the drain of N120 in the bias generator is connected to the gate of an N-channel device N210, whose source is grounded. A switch SW 160 and a resistor R151 are, furthermore, added in parallel to the bias generator between the resistor R150 and ground.

Supply voltage is connected to the sources of devices P210 and P220, which form either side of a conventional current mirror. The drain of P210, however, is connected to the drain of the N-channel device N210, which controls the voltage at the gates of current mirror devices P210 and P220, as well as at the drain of P210. As is common in current mirrors, the gate and drain of the device P210 are connected to the gate of the following P-channel device P220, whose source is connected to the supply voltage and whose drain is connected as described below to a constant conductance output stage.

The operation and implementation of current mirrors are well understood by designers of digital integrated circuits and are therefore not described in further detail here. Of note, however, is that the current of device P210 is cI, while the current of device P220 is dI. The increase, or gain, in current is therefore equal to dI/cI=d/c.

As FIG. 2 shows, the source of P220 is connected to a constant conductance output stage, more particularly to the gate and drain of an N-channel device N310, to the gate of an N-channel output drive device N320 and to ground via a switch SW470B. The gate and drain of N310 are connected, and the source of N310 is grounded. The gates of N310 and N320 are connected.

The drain of the output drive device N320 is connected to the output line of the circuit, which will normally be tied to the TTL device the system is to drive. The source of N320 is grounded.

Because the programmable bias generator is coupled to the output driver through a current mirror, with current gain that is independent of process, temperature and voltage, the output driver N320 provides a programmable drive logic signal that has several desirable properties that are also independent of process, temperature, and voltage.

The independence of the output conductance of the output driver N320 from process, temperature and voltage may be seen from the commonly used equation for output conductance $g_{o[320]}$:

$$g_{o[320]} = \text{Beta} \cdot (W_e[320]/L_e[320]) \cdot (V_e[320]) \quad \text{E5}$$

Note that if the devices N310 and N210 are made equal in size, the effective gate drive of N310 and output device N320 may be increased in accordance with the current gain d/c of the switched mirror. The mirror current gain is fixed at d/c since the P-channel devices P210 and P220 are preferably constructed using c and d multiples of unit devices with the same width-to-length ratio W/L.

Using known formulae one can show that the effective gate drive $V_{e[320]}$ of N320 is related to the effective gate drive $V_e$ of the programmable bias generator simply by the square root of the mirror current gain d/c, thus:

$$V_{e[320]} = V_e \text{ sqrt}(d/c) \quad \text{E6}$$

A combination of expressions E2 and E4–E6 above then yields the following:

$$g_{o[320]} = \text{sqrt}(d/c) \cdot [2/(R_{150})] \cdot (\text{sqrt } m/n) \cdot (\text{sqrt } m/n - 1) \quad \text{E7}$$

In the bias generator, switch SW 160 provides a resistance value of R150 between the source of N110 and ground when it is closed, since resistor R151 will be shunted. When switch SW 160 is opened, however, the resistance value will be $R_{150}+R_{151}$ (since source current will then have to pass through both resistors) and the driver output conductance will be decreased, as can be seen from the following expression, in which the denominator of the second term In the right-hand side is increased from $R_{150}$ to $(R_{150}+R_{151})$:

$$g_{o[320]} = \text{sqrt}(d/c) \cdot [2/(R_{150}+R_{151})] \cdot (\text{sqrt } m/n) \cdot (\text{sqrt } m/n - 1) \quad \text{E8}$$

As is mentioned above, this decrease is desirable when driving low-capacitance loads.

Switch SW 470B is used to turn on the output current when it is in the open condition as shown. For a positive logic output, the open condition would correspond to a logic "0", or a LOW voltage output. For a logic "1" output, SW 470B would be closed, whereby the gate voltage on N320 would drop to a value sufficiently low to turn N320 off.

The delay time to turn on the output drive device N320 tends to be constant since the current driving the gate of N320 tends to track the same variations in process, voltage, and temperature as does the variation of $V_e$. For example, as $V_e$ increases with temperature to require that a higher turn-on voltage be reached, the input current to the output device will increase in the same proportion because it is derived from a constant conductance generator.

Noting now that $\text{Beta} \cdot (W_e/L_e) \cdot V_e^2$ may be re-written as $V_e \cdot [\text{Beta} \cdot (W_e/L_e) \cdot V_e]$, one may then combine expressions E4 and E5 (taking the general version of E5 rather than the specific equation for $g_{o[320]}$) to yield:

$$I = V_e \cdot G \quad \text{E9}$$

The delay time T required for the input voltage to traverse the span $V_e$ is therefore:

$$T = V_e \cdot (C_{input}/I) = C/G \quad \text{E10}$$

Where the input capacitance is determined largely by the gate capacitance of the output device, which typically varies less than 5 percent, the variation in T will therefore be small since G is independent of process and temperature.

Figure 3:
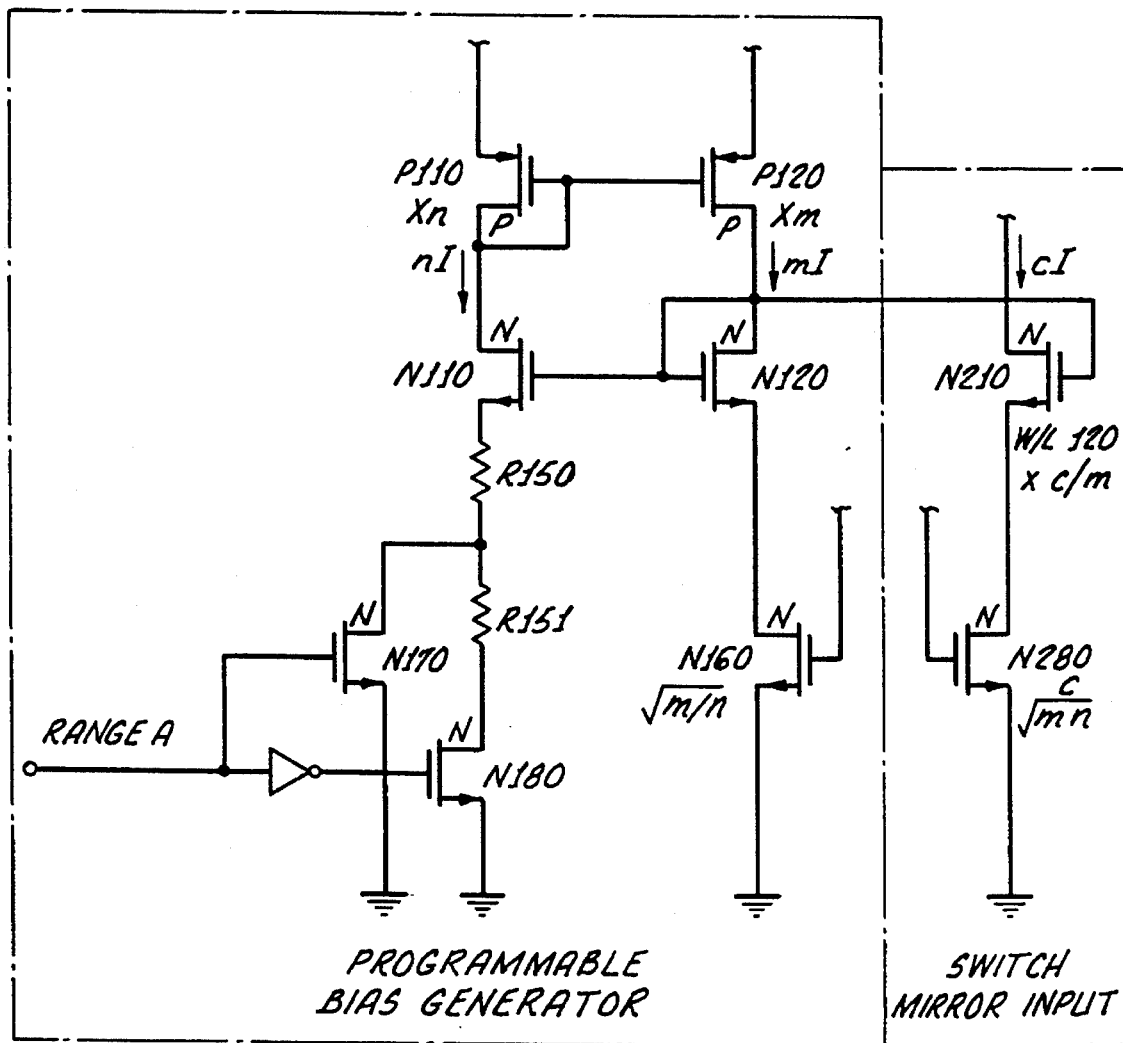
FIG. 3 is an embodiment of a programmable reference generator showing additional MOS devices used to compensate for the parasitic resistance of the MOS switches used in the programming.

The programming switch SW 160 shown in FIG. 2 may alternatively be provided with a bond wire jumper, or preferably a MOS switch. Such an arrangement is shown in FIG. 3. With reference to FIG. 3, as the bias generator is provided with a MOS switch, then a MOS device such as N160 is added to the generator to compensate for the added resistance of either switch N170 or N180. Where N170 or N180 are equal in size, and the ratio of current between the devices P110 and P120 is m/n (as is indicated in FIG. 3), the appropriate sizing for N160 is just sqrt(m/n) times the size of switch R170 or N180. This sizing assures the same voltage drop across N160 as across N170 or N180.

Also with reference to FIG. 3, where the bias generator drives the input stage of a current mirror which produces an output current cI, then an additional device N280, with a width-to-length ratio W/L of c/sqrt(mn) is added to the mirror to compensate for the switch effects. This W/L value assures that the voltage drop across N280 will be equal to the voltage drop across N160.

The advantage provided by the compensating MOS devices N170, N180 and N280 of FIG. 3 is that they greatly reduce the temperature-dependent and process-dependent effects of the switches N170 and N180 in causing variations in the programmed value of output conductance. The primary variations in output conductance will then depend only on the temperature coefficient and accuracies of resistors chosen for R150 and R160. These resistors may be polysilicon resistors, well resistors, or deposited film resistors, depending on available processes, specific resistance value, and the required temperature coefficient.

Figure 4A:
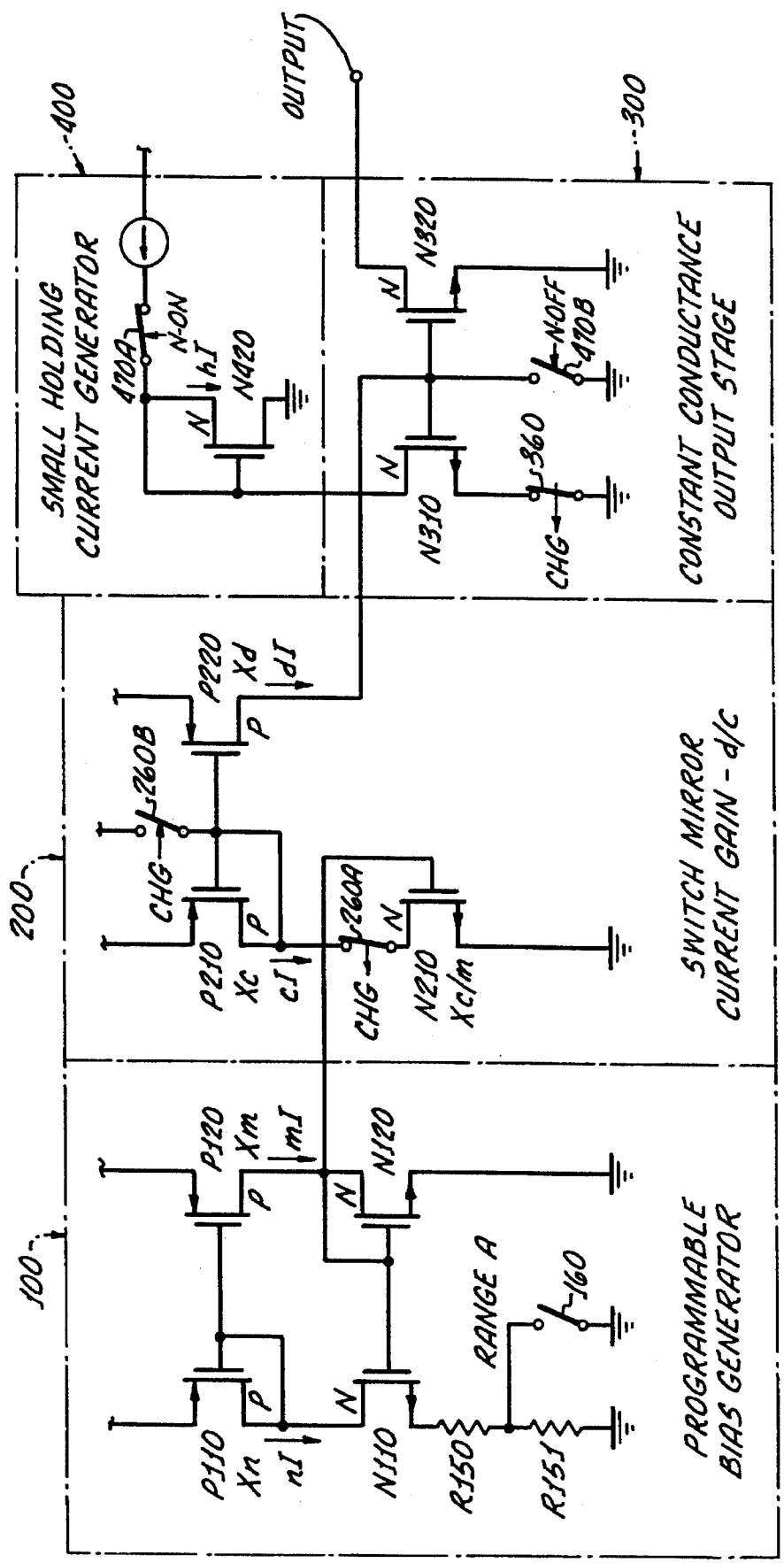
FIG. 4a is a simplified schematic diagram illustrating the addition of power saving features to the programmable conductance output driver.
Figure 4B:
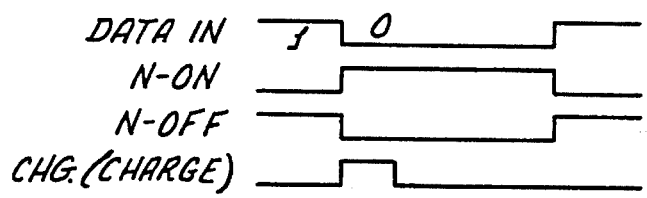
FIG. 4b is a timing diagram showing the relationship between input data and internal control signals.
Figure 4C:
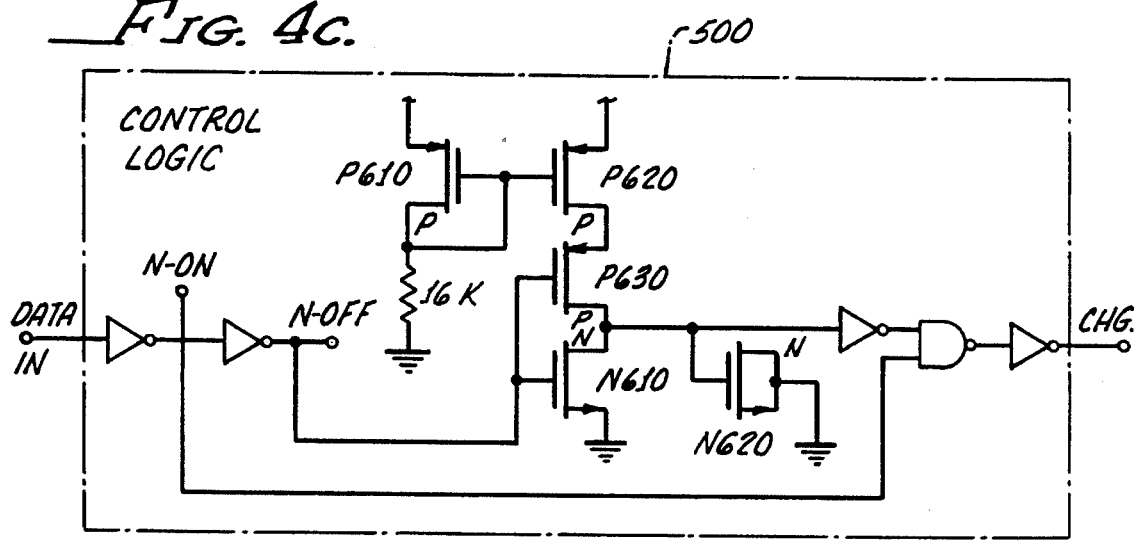
FIG. 4c illustrates a control logic structure that can implement the required relationships shown in the timing diagram of FIG. 4b.

FIGS. 4a–4c illustrate two improvements to the embodiment of the invention shown in FIG. 2. Both improvements result in reduced standby power for the output driver.

The switched current mirror of FIG. 2 passes current continuously, even when the circuit is not required to provide an output current as is the case when S470B is closed. The improvement in FIG. 4a is the addition of switches SW260A and 260B, which interrupt the flow of current from device N210 to P220 and short out the gate of P210 to the positive supply voltage. Both of these actions cause the current flow cI and dI to be reduced to zero after the high-current initial phase of driving a capacitive load is no longer required.

Once the current from P220 has been forced to zero, some minimum value of output current drive must be provided by output device N320. This minimum value of output current is provided by a small holding current generator (labelled "i gen" in FIG. 4a), which passes current hI through switch SW 470A and across device N420. Even this small holding current hi is not required for a data output of logic "1" when SW 470B is closed and no current flows through output device N320. Consequently, the holding switch SW 470A is closed when the "N ON" is HIGH, whereas the switch SW 470B at the gates of N310 and N320 is in the open position for the "N ON" portion of the timing cycle.

A load capacitance charging signal CHG controls the state of a switch between the supply voltage and the gates of the devices P210 and P220 in the current mirror. This charging signal CHG need be present for only as long as required to assure that the load capacitance has rapidly reached the full logic output voltage. The CHG signal may be generated for the required amount of time by any conventional logic circuitry that detects transition of input data from the logic "0" to the logic "1" value.

FIG. 4b illustrates the timing relationship between the signals N ON, its inverse N OFF, the charge signal CHG and the state of an input data bit DATA IN. An example of suitable detection circuitry that has these timing characteristics is illustrated in FIG. 4c, but other circuits may also be used together with the invention. Theory and experience indicate that the CHG signal will be required for less than 100 nanoseconds in typical applications.

The signals CHG, N ON and N OFF may be generated in a circuit indicated generally as circuit 600 in FIG. 4c. Referring to this figure, when the input data (DATA IN signal) transitions from a "1" to a "0" as shown in FIG. 4a, an MOS capacitor N620 will no longer be clamped to ground, but rather will begin to charge through a switch P630. The switch P630 receives a constant current from the constant current generator consisting of the 16 k resistor (for example) and the mirror P610, P620.

Immediately when the DATA IN signal changes from a "1" to a "0", N ON changes from a "0" to a "1" and the convention NAND gate output changes from a "1" to a "0". The output from the NAND gate passes through an inverter an becomes the CHG signal, which changes from a "0" to a "1". This CHG signal is then routed to the switch mirror, whereas the N ON signal is used to turn on the small holding current generator.

As the MOS capacitor N620 charges past the logic threshold of the inverter connected to its top plate, (its gate), the inverter output changes from "1" to "0" and causes the NAND gate output to rise from "0" to "1", thereby driving the CHG signal from "1" to "0". The size of the MOS capacitor may be chosen for any desired duration of the CHG signal, for example, from 10 to 100 nanoseconds.

When the DATA IN signal changes from "0" to "1", the CHG signal is immediately terminated and the MOS capacitor discharges rapidly through the N-channel device N610. At the same time, the N ON signal changes from "1" to "0" and immediately turns off the small holding current generator. The N OFF signal (the inverse of N ON) also changes from "0" to "1", turns on the switch SW 470A, and immediately turns off the output driver N320 by shorting its gate to ground. The switch and charging control signals N ON, N OFF, CHG, and those applied to the various switches in the embodiments of the invention may alternatively be generated in a known manner by other conventional hardware structures.

Figure 5:
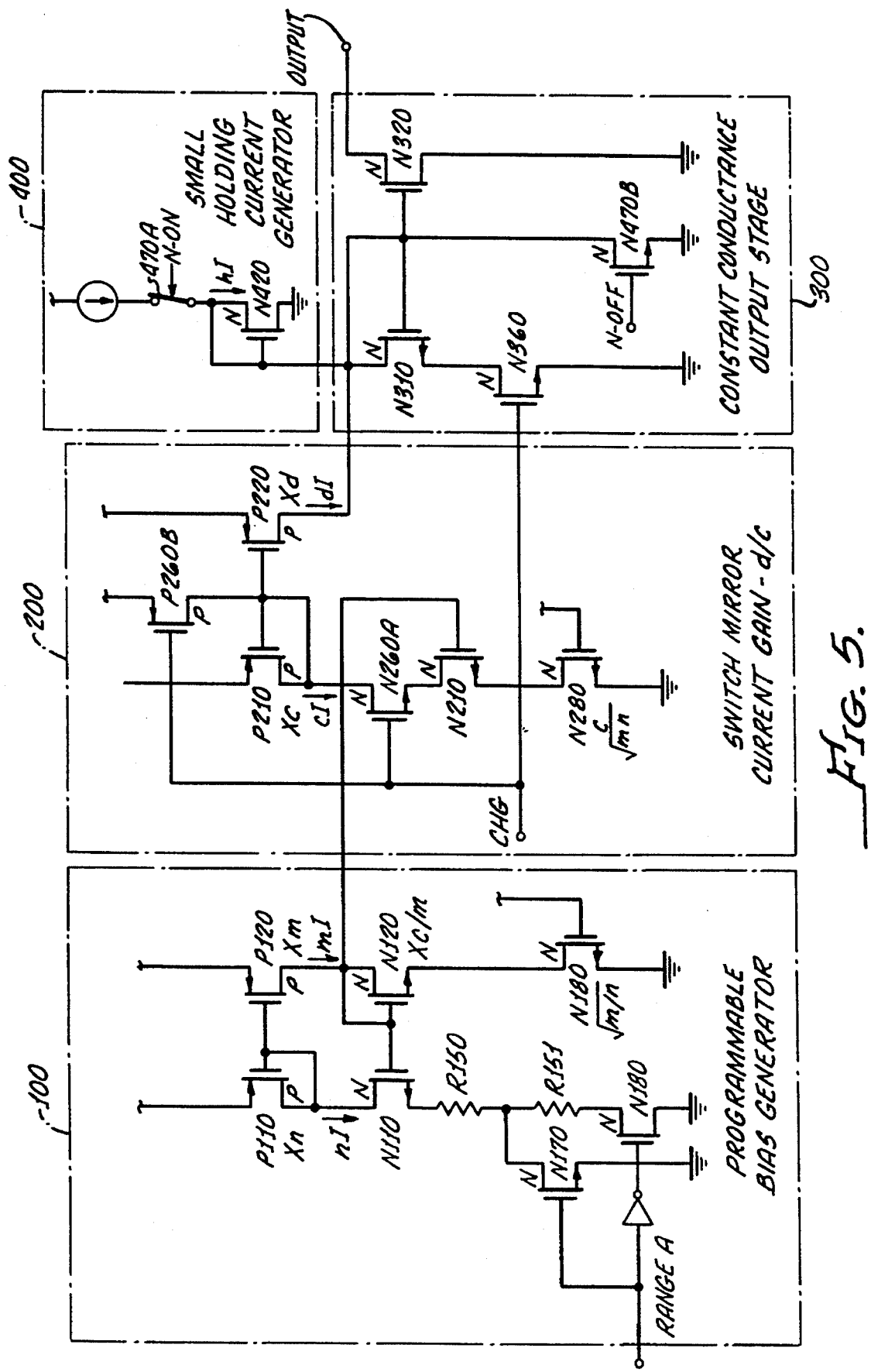
FIG. 5 is a schematic diagram showing MOS devices used for switches in a switched current mirror.

FIG. 5 is a schematic diagram showing the MOS devices preferably used to implement the various switches in the system that are controlled by the CHG signal. Thus, the P-channel MOS device P260B corresponds to the switch SW 260B in FIG. 4a; switch SW 260A is implemented by P260A; and switch SW 360 is implemented by the N-channel device N360. Also, switch SW 470 B, which is controlled by the N OFF signal, is shown implemented by the N-channel device N470B. The implementation of simple switches such as these is well understood in the field of circuit design.

Figure 6A:
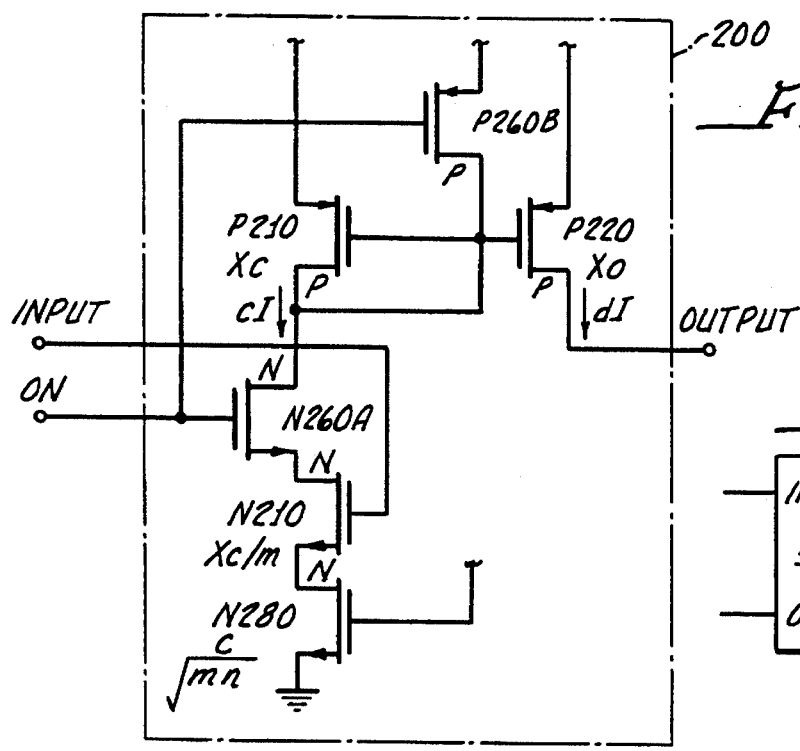
FIG. 6(a) is a schematic of a switch mirror block.
Figure 6B:
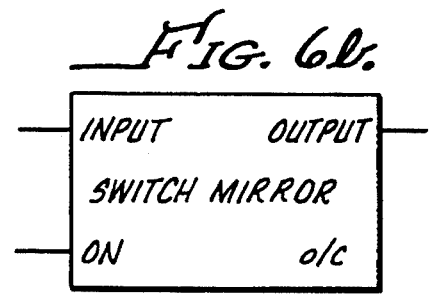
FIG. 6(b) is a symbolic representation of the switch mirror.

In FIG. 6a and 6b, the switched mirror and its symbolic block representation are shown. In this block representation, the switched mirror receives the input signal INPUT as before from the drain of the device N120 of the bias generator (see FIG. 5). An ON signal is also applied to the mirror; this ON signal corresponds to the CHG signal shown and described above. As FIG. 6b indicates, the current mirror acts to provide an output current that is d/c times its input current; this is also described above.

A switched current mirror using a lower current ratio than the ones used for the charging current may be used to provide the small holding current generator indicated in FIG. 5. Such an arrangement is shown in FIG. 7.

In the embodiments described above, a single switched current mirror stage with a current gain of d/c is included between the bias generator and the constant capacitance output stage. The system according to the invention is not limited to such single-value implementations.

Figure 7:
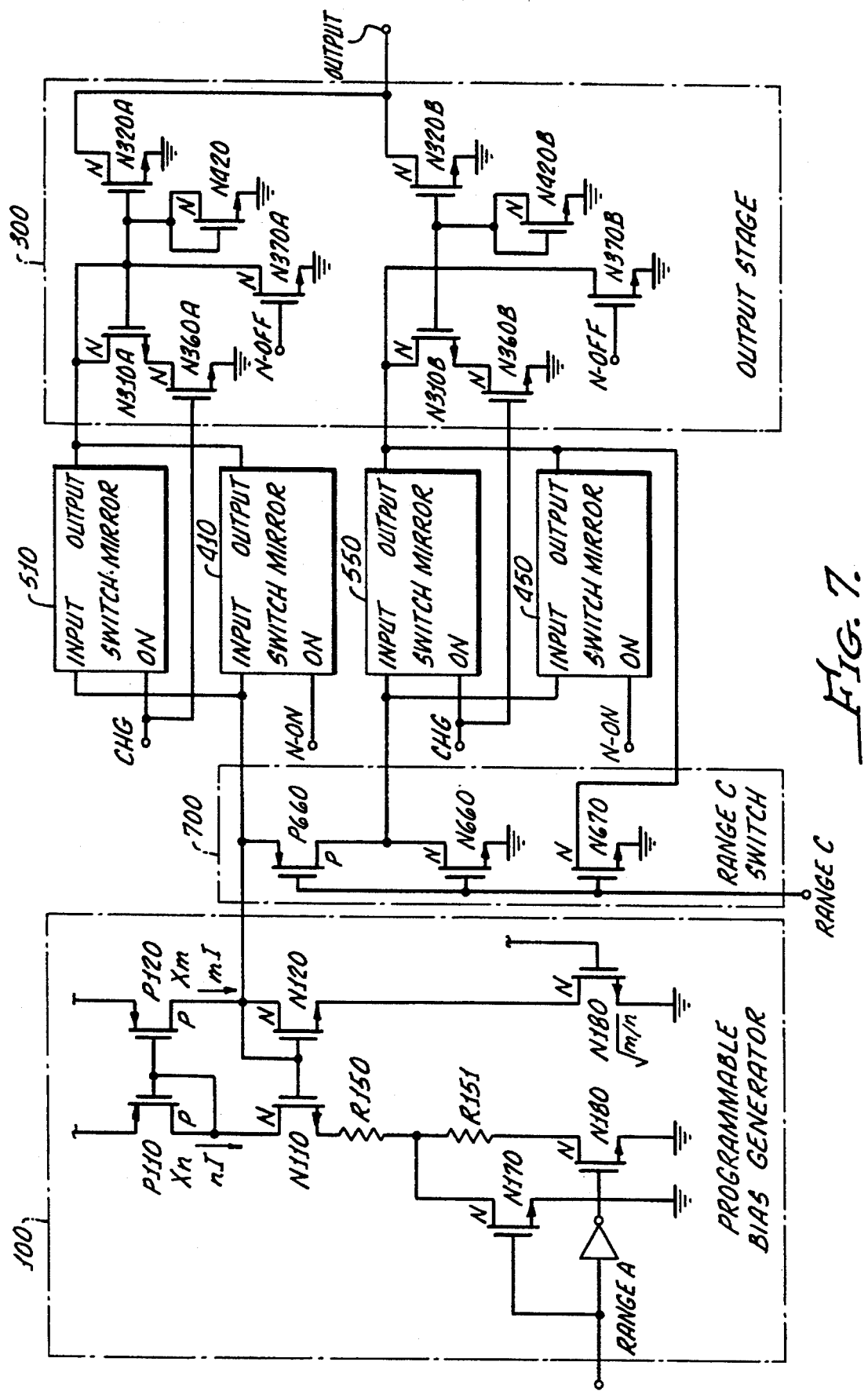
FIG. 7 illustrates an embodiment of the invention providing the programming of four output conductance ranges.

FIG. 7 illustrates an embodiment of the invention which provides four charging current ranges for programming. Two switched mirrors are included to provide two programmable levels of output current from the generator at output devices N320A or N320B. The two switched mirrors preferably have the same structure as described above for the single-mirror implementations and are indicated generally at 510 and 550 in FIG. 7.

Note that the output stage in this embodiment includes a pair of output devices N320A and N320B, each corresponding to the single driver N320 in FIG. 5, as well as a set of gate control devices corresponding to N360 and each with a switch N370A, N370B corresponding to the single switch N470B in FIG. 5. The drains of the two output drive devices N320A and N320B are connected. The gates of the devices N360A and N360B are connected to the CHG signal. The drains and gates of devices N310A and N310B are connected, respectively, to the outputs of the switch mirrors 510 and 550 (controlled by the CHG signal) and 410 and 450 (controlled by the N ON signal. These current mirrors preferably have the structure shown FIGS. 6a and 6b.

According to this embodiment, switch mirror 550 is enabled only if the "RANGE C" programming control circuit is a logic "0". In that case, a P-channel device P660 in a RANGE C Switch 700 (which forms a mirror selection switching device) is driven into a conductive state and the bias generator output voltage at the drain of N120 is allowed to pass to the input of switch mirror 550.

In the case that the switch mirror located at 550 is to be disabled by a logic "1" for the RANGE C control signal, P660 is cut off and N660 is turned on and grounds he input of switch mirror 550. In addition, device N670 is turned on to return any leakage current from mirror 550 output to ground and to assure that the output driver N320B is turned off.

Holding current mirrors 410 and 450 provide a small holding current to guarantee that the N320A and N320B outputs remain on at a desired output conductance value after the initial charging phase is complete. By using switch mirror blocks as shown in FIGS. 6a and 6b, which are connected to the input bias generator, the driver output conductance level is constant and independent of process, temperature and power supply variation.

Holding current mirrors 410 and 450 must be turned off to save power when the data input is a logic "1". This is accomplished by using the signal N ON to drive an ON input to each switch mirror 410, 450. The N ON signal is derived from an inverter connected to the logic input, and is thus the logical inverse of the input data bit. Switch devices N370A and N370B short all switch mirror leakage current to ground in response to the N OFF signal (the logical inverse of N ON) when the data input is a logic "1". These switches assure that output devices N320A and N320B are turned off. The N OFF signal is derived from a logic buffer consisting of two inverters connected is series and to the data input (see FIG. 4c).

By varying device sizes and current gains in the switched mirrors 510 and 550 and also by varying the sizes of the output devices N320A and N320B, many possible programming ranges may be provided. The highest output conductance in the preferred embodiment is programmed by setting RANGE A (at the input of the bias generator) equal to logic "1" and RANGE C equal to a logic "0". Although four programming ranges may be selected by the combination of the RANGE A and RANGE C logic signals in the embodiment of FIG. 7a many more programing ranges are possible by using additional programming resistors or switched mirrors. In other words, more than two complete switch mirrors 510/410 and 550/450 may be included, as long as additional selection switches are included in the RANGE C switching device and suitable control signals are provided as above.

Additionally, the invention is not restricted by the polarity of the embodiments illustrated in the figures. The invention may be easily extended using known methods to add switched mirrors and output drivers of opposite polarity to drive CMOS loads, or use alternate semiconductor technology to drive loads of different output voltages or signal polarities.

I claim:

1. A logic output driver, for driving an attached logic device, including a bias generator (100) and an output stage, (300), characterized in that:

a current mirror (200; P210 P220) is connected to the bias generator (100) the output stage (400) is connected to the current mirror (200) and at least one of the group consisting of the bias generator (100), the output stage (300) and the current mirror (200) is programmable, the driver being such that the conductance of the output stage (300) can be held substantially constant at a selected one of a predetermined number of predetermined conductance values substantially independent of changes in process, supply voltage and temperature, and wherein the bias generator is a bias current generator (100) including a bias current mirror (P110, P120) and a pair of bias output devices (N110, N120).

2. A logic output driver according to claim 1, wherein the current mirror is a switchable current mirror (P210, P220) with a switchable mirror input gate (N210) connected to a bias current output of the current generator.

3. A logic output driver according to claim 2, wherein a pair of bias resistors (R150, R151) is included in the path to ground of a predetermined one of a pair of bias output devices of the bias generator and a pair of bias programming switching devices (N170, N180) is included in the path to ground of the same bias output device as the bias resistors (R150, R151), a resistance compensation device (N160) being included in the switchable current mirror to compensate for the resistance of the bias programming switching devices (N170, N180).

4. A logic output driver, for driving an attached logic device, including a bias generator (100) and an output stage (300), characterized in that:

a current mirror (200; P210 P220) is connected to the bias generator (100), the output stage (400) is connected to the current mirror (200) and at least one of the group consisting of the bias generator (100), the output stage (300) and the current mirror (200) is programmable, the driver being such that the conductance of the output stage (300) can be held substantially constant at a selected one of a predetermined number of predetermined conductance values substantially independent of changes in process, supply voltage and temperature, and wherein the output stage (300) includes an output drive device (N320) and there is a two-stage output semiconductor switch (SW 470B) to conduct and shunt a gate of the output drive device (N320) when an input data bit has a first state and to open when the input data bit has a second state.

5. A logic output driver, for driving an attached logic device, including a bias generator (100) and an output stage (300), characterized in that:

a current mirror (200; P210 P220) is connected to the bias generator (100), the output stage (400) is connected to the current mirror (200) and at least one of the group consisting of the bias generator (100), the output stage (300) and the current mirror (200) is programmable, the driver being such that the conductance of the output stage (300) can be held substantially constant at a selected one of a predetermined number of predetermined conductance values substantially independent of changes in process, supply voltage and temperature, and comprising a switchable current holding circuit, comprising a holding current generator (i_gen) and a holding switch (Sw 470A), included in the output state to maintain a minimum output current at a predetermined slew rate into the attached logic device when the attached logic device is in a low logical state.

6. A logic output driver, for driving an attached logic device, including a bias generator (100) and an output stage (300), characterized in that:

a current mirror (200; P210 P220) is connected to the bias generator (100), the output stage (400) is connected to the current mirror (200) and at least one of the group consisting of the bias generator 9100), the output stage (300) and the current mirror (200) is programmable, the driver being such that the conductance of the output stage (300) can be held substantially constant at a selected one of a predetermined number of predetermined conductance values substantially independent of changes in process, supply voltage and temperature, and wherein the current mirror includes a quick-charging arrangement (600) that generates a charging signal (CHG) as a predetermined function of state transitions of the attached logic device.

7. A logic output driver, for driving an attached logic device, including a bias generator (100) and an output stage (300), characterized in that:

a current mirror (200; P210 P220) is connected to the bias generator (100), the output stage (400) is connected to the current mirror (200) and at least one of the group consisting of the bias generator (100), the output stage (300) and the current mirror (200) is programmable, the driver being such that the conductance of the output stage (300) can be held substantially constant at a selected one of a predetermined number of predetermined conductance values substantially independent of changes in process, supply voltage and temperature, and including a switchable mirror array including a plurality of switch mirrors (510, 410; 55, 450), each having a different output current, and a mirror selection device (700) connected to the switch mirrors that activates a selected one of the switch mirrors depending on the state of a selection input signal (RANGE_C).

8. An output driver for providing a signal to a load, including, a bias generator for providing a control current, a current mirror responsive to the control current for producing in the control current a gain that is independent of variations in process, temperature and voltage, an output generator responsive to the gain in the control current for providing a signal to the load with a substantially constant conductance, and first means operatively coupled to the output generator for providing an input signal having first and second logic levels and for providing for the production of the substantially constant conductance in the output generator only for the first logic level in the input signal.

9. An output driver as set forth in claim 8, including, the load having a capacitance, second means included in the bias generator for adjusting the value of the substantially constant conductance in the output generator in accordance with the variations in the capacitance in the load, and third means included in the bias generator for compensating for the operation of the second means in adjusting the value of the substantially constant conductance in the output generator.

10. An output driver as set forth in claim 9, including, the second means providing for a variable impedance in accordance with variations in the capacitance of the load, and the third means compensating for the variations in the impedance in the second means.

11. An output driver as set forth in claim 8, including, means included in the bias generator for reducing the effects of the variations in temperature and process in the bias generator on the substantially constant conductance in the output generator, and means included in the current mirror for reducing the effects of the variations in temperature and process in the current mirror on the substantially constant conductance in the output generator.

12. An output driver as set forth in claim 8 and including, means included in the current mirror for interrupting the flow of current through the current mirror when the output generator is in a standby operation, and means included in the output generator for maintaining a holding current in the output generator when the output generator is in the standby operation.

13. An output driver as set forth in claim 8 and including, the output generator providing an output current, and third means included in the current mirror and programmable to provide for different magnitudes of the output current from the output generator.

14. An output driver as set forth in claim 13, including, a plurality of transistors in the output generator, the sizes of the transistors in the output generator being adjustable in accordance with the programming in the current mirror to provide for different magnitudes of the current from the current mirror.

15. An output driver for providing a signal to a load having a variable capacitance, including, means for providing an input signal having first and second logic levels, a bias generator for providing a control current, means included in the bias generator for providing impedances having adjustable values, means included in the bias generator for programming the impedances to provide adjustable values in accordance with the variations in the capacitance in the load, a current mirror for providing a gain in the control current, and an output generator operatively coupled to the current mirror and responsive to the control current from the current mirror and to the input signal for providing a substantially constant conductance to produce the signal to the load in accordance with the first logic level in the input signal.

16. An output driver as set forth in claim 15, including, means included in the bias generator for reducing the effects of variations in temperature and process on the production of the constant conductance in the output generator.

17. An output driver as set forth in claim 15, including, means included in the current mirror for interrupting the flow of current through the current mirror when the output generator is in a standby condition, and means included in the current generator for maintaining a holding current in the output generator when the output generator is in the standby condition.

18. An output driver is as set forth in claim 15, including, programmable means included in the current mirror for adjusting the gain provided by the current mirror in the control current, and means included in the output generator for adjusting the value of the substantially constant conductance in the output generator in accordance with the adjustment in the gain in the control current by the programmable means in the current mirror.

19. An output driver as set forth in claim 16, including, programmable means included in the current mirror for adjusting the gain provided by the current mirror in the control current, and means included in the output generator for adjusting the value of the substantially constant conductance in the output generator in accordance with the adjustment by the programmable means in the gain in the current mirror, and means included in the output generator for eliminating the holding current in the output generator when the output generator produces the signal to the load in accordance with the first logic level in the input signal.

20. An output driver for providing a signal to a load having a variable capacitance, including, a bias generator for providing a control signal, means for providing an input signal having first and second logic levels, a current mirror for providing a gain in the control signal, programmable means included in the current mirror for providing a controlled adjustment in the gain in the current mirror, an output generator responsive to the control current from the current mirror for providing a substantially constant conductance in the output generator during the production of the first logic level in the input signal and for producing an output signal for introduction to the load during the productions of the first logic level in the input signal, and means included in the output generator for adjusting output generator in accordance with the adjustment in the gain of the control current in the current mirror.

21. An output driver as set forth in claim 20, including, means included in the current mirror for interrupting the control current in the current mirror when the output generator is operating in a standby condition, and means included in the output generator for producing a holding current when the output generator is operating in the standby condition.

22. An output generator as set forth in claim 20, means being included in the current mirror for minimizing any effects of variations in temperature and process in maintaining the production of the substantially constant conductance in the output generator.

23. In a combination as set forth in claim 22, means for providing an adjustable impedance, and programmable means included in the bias generator for adjusting the impedance in accordance with the variations in the capacitance in the load.

* * * * *

UNITED STATES PATENT AND TRADEMARK OFFICE
CERTIFICATE OF CORRECTION

PATENT NO. : 5,455,522
DATED : October 3, 1995
INVENTOR(S) : Anthony Mark Jones

It is certified that error appears in the above-indentified patent and that said Letters Patent is hereby corrected as shown below:

Column 1, line 23, delete the comma "," from before the word "current". Column 2, line 3, an -- a -- should be inserted after "has"; Column 2, line 13, delete the comma "," from before "voltage". Column 5, line 9, delete "In" and insert therefor -- in --; Column 5, line 55, delete "R170" and insert therefor -- N170 --. Column 6, line 26, delete "hi" and insert therefor -- hI --; Column 6, line 62, delete "an" and insert therefor -- and --. Column 7, line 58, insert -- N310, -- before "N360"; Column 7, line 66, insert -- ) -- after "signal". Column 8, line 34, delete "is" and insert therefor -- in --. Column 10, line 3, delete "9100)" and insert therefor -- (100) --.

Signed and Sealed this

Fifteenth Day of October, 1996

Attest:

BRUCE LEHMAN

Attesting Officer          Commissioner of Patents and Trademarks